(12) United States Patent
Hendrickson

(10) Patent No.: US 9,019,762 B2
(45) Date of Patent: Apr. 28, 2015

(54) METHODS OF OPERATING MEMORY DEVICES

(71) Applicant: Micron Technology, Inc., Boise, ID (US)

(72) Inventor: Nicholas Hendrickson, Burnsville, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/148,256

(22) Filed: Jan. 6, 2014

(65) Prior Publication Data

US 2014/0119128 A1    May 1, 2014

Related U.S. Application Data

(63) Continuation of application No. 13/191,836, filed on Jul. 27, 2011, now Pat. No. 8,625,345.

(51) Int. Cl.
*G11C 16/26* (2006.01)
*G11C 16/04* (2006.01)
*G11C 11/56* (2006.01)

(52) U.S. Cl.
CPC ............ *G11C 16/26* (2013.01); *G11C 16/0458* (2013.01); *G11C 11/5642* (2013.01); *G11C 16/0483* (2013.01); *G11C 2211/5642* (2013.01)

(58) Field of Classification Search
CPC .... G11C 16/26; G11C 16/0483; G11C 16/04; G11C 16/0458; G11C 11/5642; G11C 2211/5642

USPC ............ 365/185.03, 185.17, 185.18, 185.21, 365/189.04
See application file for complete search history.

(56) References Cited

U.S. PATENT DOCUMENTS

| | | | |
|---|---|---|---|
| 5,864,569 A * | 1/1999 | Roohparvar | 714/773 |
| 5,870,218 A | 2/1999 | Jyouno et al. | |
| 6,195,284 B1 | 2/2001 | Egawa | |
| 6,381,671 B1 | 4/2002 | Ayukawa et al. | |
| 6,385,085 B2 | 5/2002 | Sato et al. | |
| 6,587,373 B2 | 7/2003 | Talreja | |
| 7,054,197 B2 | 5/2006 | Vimercati | |
| 7,106,626 B2 | 9/2006 | Goldman et al. | |
| 7,321,512 B2 | 1/2008 | Vimercati et al. | |
| 7,345,905 B2 | 3/2008 | Pio et al. | |
| 7,359,240 B2 | 4/2008 | Lee et al. | |
| 7,405,977 B2 | 7/2008 | Lee et al. | |
| 7,554,861 B2 | 6/2009 | Vimercati et al. | |
| 8,154,920 B2 | 4/2012 | Kim et al. | |
| 2007/0016722 A1 | 1/2007 | Lee et al. | |
| 2009/0147575 A1 | 6/2009 | Nam et al. | |
| 2010/0226172 A1 | 9/2010 | Kim et al. | |
| 2013/0107623 A1* | 5/2013 | Kavalipurapu et al. .. | 365/185.03 |

* cited by examiner

*Primary Examiner* — Tan T. Nguyen
(74) *Attorney, Agent, or Firm* — Dicke, Billig & Czaja, PLLC

(57) ABSTRACT

Methods of operating a memory device include determining whether each memory cell selected for a sense operation has any data state of a first subset of data states of a plurality of data states, wherein whether a memory cell has a data state that is a member of the first subset of data states determines a data value of a first portion of the data state of that memory cell. The methods further include initiating a transfer of the data values of the first portions of the data states of the selected memory cells and continuing the particular sense operation to sense for additional data states of the plurality of data states.

20 Claims, 11 Drawing Sheets

METHODS OF OPERATING MEMORY DEVICES

RELATED APPLICATION

This application is a Continuation of U.S. patent application Ser. No. 13/191,836, titled "DETERMINING AND TRANSFERRING DATA FROM A MEMORY ARRAY," filed Jul. 27, 2011 (allowed), which is commonly assigned and incorporated herein by reference.

TECHNICAL FIELD

The present disclosure relates generally to semiconductor memories and, in particular, in one or more embodiments, the present disclosure relates to sensing data stored in non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data state of each cell. Data can be read from the memory cells by performing a read operation. Memory cells are typically programmed using erase and programming cycles. For example, memory cells of a particular block of memory cells are first erased and then selectively programmed.

Memory cells (e.g., flash memory cells) can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. SLC memory permits the storage of a single binary digit (e.g., bit) of data on each memory cell. Meanwhile, MLC technology permits the storage of two or more binary digits per cell, depending on the quantity of Vt ranges assigned to the cell and the stability of the assigned Vt ranges during the lifetime operation of the memory cell. The number of Vt ranges (e.g., levels) used to represent a bit pattern comprised of N-bits might be $2^N$, where N is an integer. For example, one bit may be represented by two ranges, two bits by four ranges, three bits by eight ranges, etc. MLC memory cells may store even or odd numbers of bits on each memory cell, and schemes providing for fractional bits are also known. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

FIG. 1 illustrates an example of Vt ranges 100 for a population of MLC (four level) (e.g., 2-bit) memory cells. For example, a memory cell might be programmed to a Vt that falls within one of four different Vt ranges 102-108 of 200 mV, each being used to represent a data state corresponding to a bit pattern comprised of two bits. Typically, a dead space 110 (e.g., sometimes referred to as a margin and might have a range of 200 mV to 400 mV) is maintained between each range 102-108 to keep the ranges from overlapping. As an example, if the Vt of a memory cell is within the first of the four Vt ranges 102, the cell in this case is storing a logical '11' state and is typically considered the erased state of the cell. If the Vt is within the second of the four Vt ranges 104, the cell in this case is storing a logical '10' state. A Vt in the third Vt range 106 of the four Vt ranges would indicate that the cell in this case is storing a logical '00' state. Finally, a Vt residing in the fourth Vt range 108 indicates that a logical '01' state is stored in the cell. For a memory cell having a particular data state represented by a bit pattern 'XY', the 'X' position bit might be considered the Most Significant Bit (MSB) and the 'Y' position bit might be considered the Least Significant Bit (LSB), for example.

Determining the data state of a selected memory cell involves performing a sense (e.g., read) operation on the memory cell. During the sense operation, a sense potential which increases over time can be applied to the selected memory cell. The MSB and the LSB of the data state of a selected memory cell can be determined when the applied sense potential has reached the highest level to be applied to the selected memory cells. However, waiting to determine both the MSB and LSB can result in a delay which can limit how fast data can be read from the memory device during a sense operation, for example.

For the reasons stated above, and for other reasons stated below which will become apparent to those skilled in the art upon reading and understanding the present disclosure, there is a need in the art for alternate methods for performing data sensing operations in memory devices.

DETAILED DESCRIPTION

Figure 1:
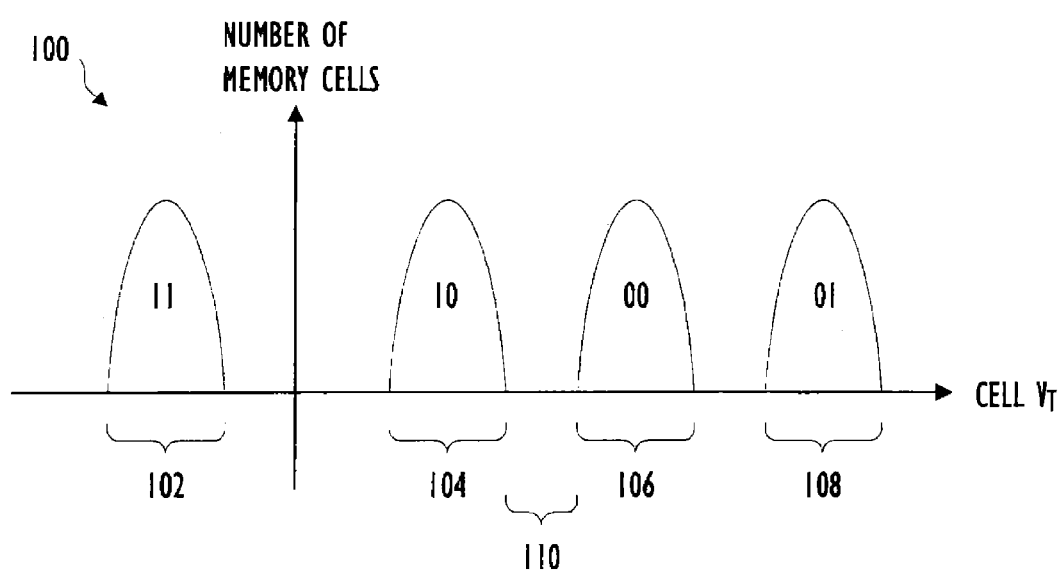
FIG. 1 shows a graphical representation of threshold voltage ranges in a population of memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense.

Figure 2:
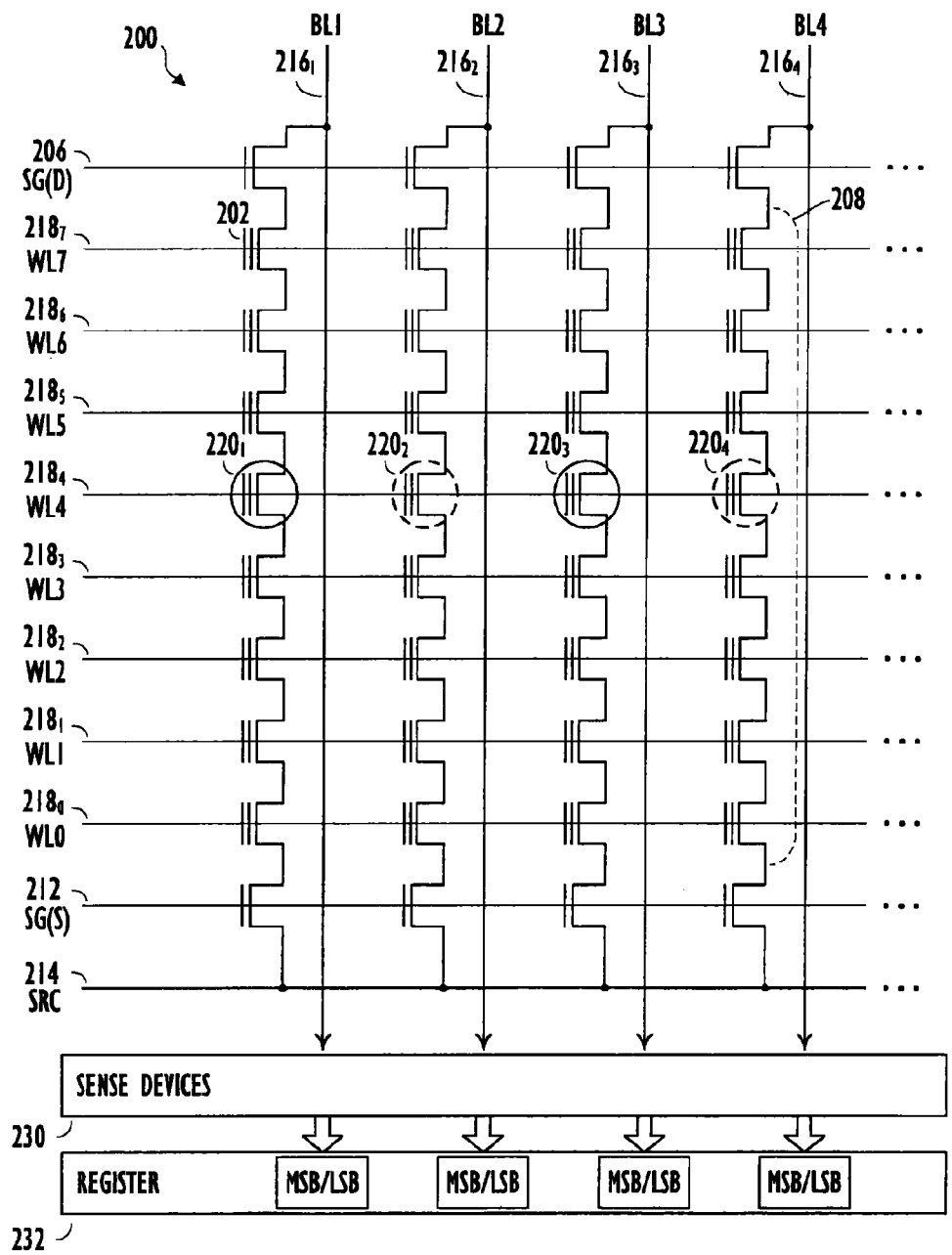
FIG. 2 shows a schematic representation of a typical array of NAND configured memory cells.

Flash memory typically utilizes one of two basic architectures known as NAND Flash and NOR Flash. The designation is derived from the logic used to read the devices. FIG. 2 illustrates a NAND type flash memory array architecture 200 wherein the memory cells 202 of the memory array are logically arranged in an array of rows and columns. In a conventional NAND Flash architecture, "rows" refer to memory cells $220_{1-4}$ having commonly coupled control gates, while "columns" refer to memory cells coupled as a particular string of memory cells 208, for example. The memory cells 202 of the array are arranged together in strings (e.g., NAND strings), typically of 8, 16, 32, or more each. Each memory cell of a string are connected together in series, source to drain, between a source line 214 and a data line 216, often referred to as a bit line. The array is accessed by a row decoder (not shown) activating a logical row of memory cells by selecting a particular access line, often referred to as a word line, such as WL7-WL0 $218_{7-0}$, for example. Each word line 218 is coupled to the control gates of a row of memory cells. Bit lines BL1-BL4 $216_{1-4}$ can be driven high or low depending on the type of operation being performed on the array. These bit lines BL1-BL4 $216_{1-4}$ are coupled to sense devices (e.g., sense amplifiers) 230 that detect the state of a target memory cell by sensing voltage or current on a particular bit line 216, for example. As is known to those skilled in the art, the number of memory cells, word lines and bit lines might be much greater than those shown in FIG. 2.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor (e.g., substrate) on which the block of memory cells are formed, and thus to the channels of the memory cells, in order to remove charges which might be stored on the charge storage structures (e.g., floating gates or charge traps) of the block of memory cells.

Programming typically involves applying one or more programming pulses to a selected word line (e.g., WL4 $218_4$) and thus to the control gate of each memory cell $220_{1-4}$ coupled to the selected word line. Typical programming pulses start at or near 15V and tend to increase in magnitude during each programming pulse application. While the program voltage (e.g., programming pulse) is applied to the selected word line, a potential, such as a ground potential, is applied to the channels of these memory cells, resulting in a charge transfer from the channel to the charge storage structures of memory cells targeted for programming More specifically, the charge storage structures are typically charged through direct injection or Fowler-Nordheim tunneling of electrons from the channel to the storage structure, resulting in a Vt typically greater than zero, for example. In addition, an inhibit voltage is typically applied to bit lines not coupled to a NAND string containing a memory cell that is targeted (e.g., selected) for programming. Typically a verify operation is performed following each applied programming pulse to determine if the selected memory cells have achieved their target (e.g., intended) programmed state. A verify operation generally includes performing a sense operation to determine if a threshold voltage of a memory cell has reached a particular target value.

Figure 3:
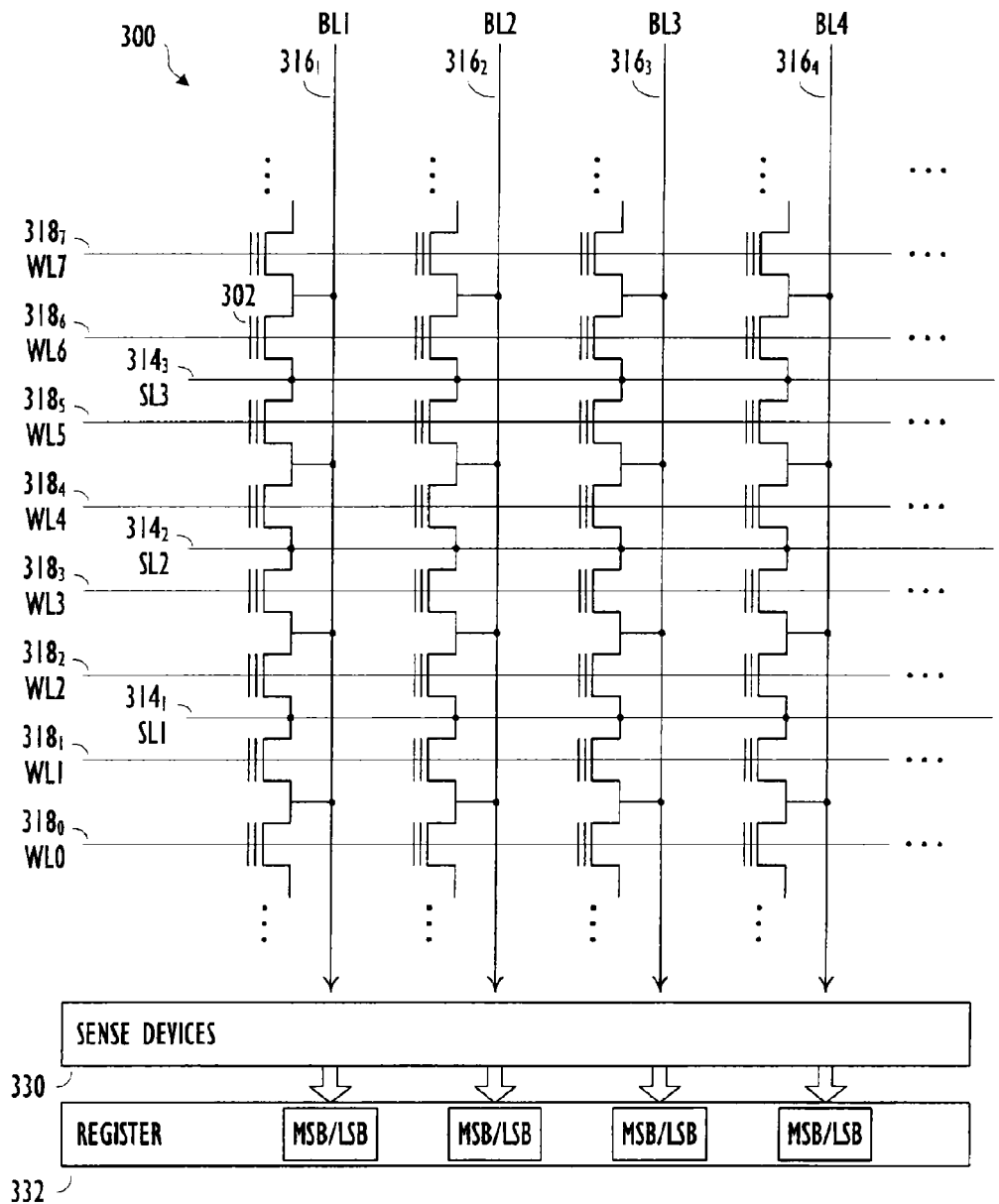
FIG. 3 shows a schematic representation of a typical array of NOR configured memory cells.

FIG. 3 illustrates a NOR type flash memory array architecture 300 wherein the memory cells 302 of the memory array are logically arranged in an array of rows and columns. Each memory cell 302 is coupled between a source line 314 and a bit line 316. The array is accessed by a row decoder (not shown) activating a logical row of memory cells by selecting a particular word line, such as WL7-WL0 $318_{7-0}$, for example. Each word line 318 is coupled to the control gates of a row of memory cells. Bit lines BL1-BL4 $316_{1-4}$ can be driven high or low depending on the type of operation being performed on the array. Bit lines BL1-BL4 $316_{1-4}$ are coupled to sense devices 330 that detect the state of a target memory cell by sensing voltage or current on a particular bit line 316, for example. As is known to those skilled in the art, the number of memory cells, word lines and bit lines might be much greater than those shown in FIG. 3.

A sense operation typically involves applying an increasing (e.g., stepped) potential to the word line of the selected row of memory cells. As the applied sense potential increases, the sense amplifiers, such as sense amplifiers 230/330, detect an ON condition of memory cells of the selected row. For example, the sense amplifiers are responsive to a memory cell having a particular threshold voltage which falls within one of the Vt ranges shown in FIG. 1, for example. By determining the threshold voltage of a selected memory cell, the data state of the memory cell can be determined.

After the MSB and LSB data has been sensed from the selected memory cells, the MSB and LSB data values are stored (e.g., latched) in a register 232/332 as shown in FIGS. 2 and 3, respectively. After all the MSB and LSB data from each selected memory cell has been latched in the register 232/332, control circuitry of the memory device (not shown) facilitates the output of the latched MSB and LSB data from the register and out of the device, such as to a memory access device (not shown) coupled to the memory device, for example. However, as discussed above, having to wait until the all of the MSB and LSB data values have been sensed from all of the selected memory cells and then latched into a register might cause undesirable delays between the read request, such as initiated by a memory access device, and the output of data from the memory device.

Figure 4:
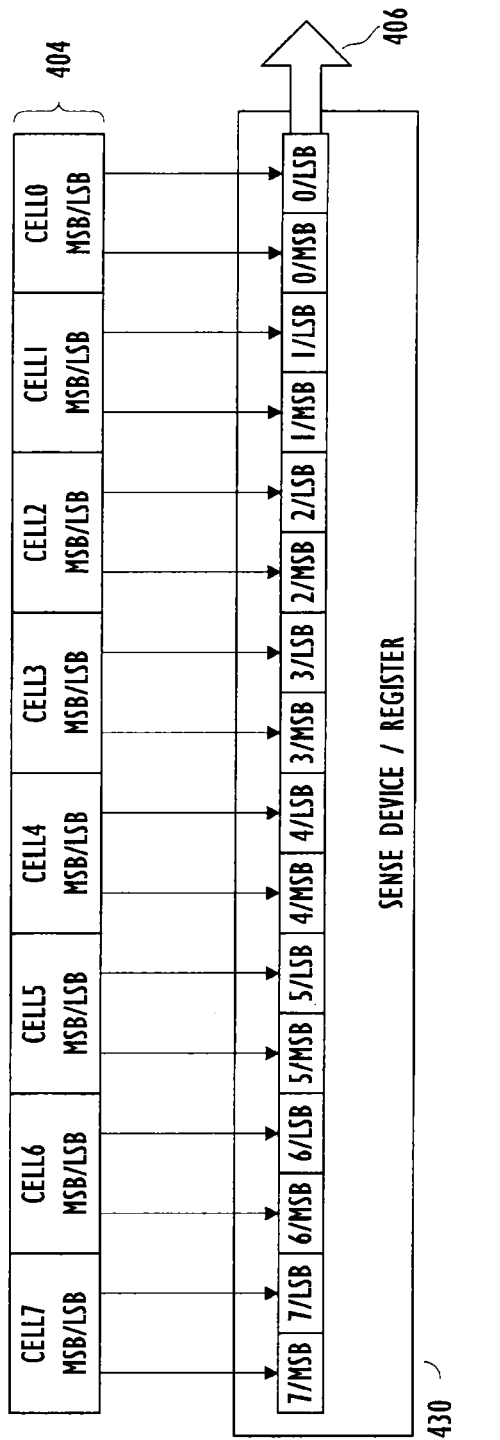
FIG. 4 illustrates a simplified block diagram of a portion of a typical memory device.

FIG. 4 illustrates a selected row of memory cells CELL7-CELL0 404 coupled to sense device and register circuitry (e.g., a register, such as a data register) 430 of a typical memory device. In order to determine the data state of each of the selected memory cells 404, a sense operation can be performed on the selected memory cells 404 to determine the MSB and the LSB data state values and latch them in the register 430. After the MSB and LSB of each selected memory cell has been determined and latched in the register 430 the data is transferred (e.g., sent out) from the register 406.

Apparatus (e.g., circuitry, memory device, systems including memory devices, etc.) and methods according to various embodiments of the present disclosure facilitate a transfer of data from the memory device to occur without a limitation of waiting for all possible data states to be determined from selected memory cells before any data is transferred (e.g., output) from the memory device.

According to various embodiments, a first portion (e.g., MSB) of a data state of the selected memory cell is determined during a first sense phase of an operation (e.g., a read operation) performed on the selected memory cell (e.g., a multi-level memory cell). The first portion of the data state value is stored (e.g., latched) in register circuitry of the memory device. Following the completion of the first sense phase, control circuitry of the memory device initiates a transfer of the determined MSB data from the register and out of the memory device, such as to a memory access device (e.g., processor), for example. As the MSB data is transferred, a second sense phase occurs to determine a second portion (e.g., LSB) of the data state of the selected memory cell. The data obtained during the second sense phase is also loaded into the register circuitry. The control circuitry of the memory device then initiates a transfer of the second set of determined data (e.g., LSB data) from the register circuitry and out of the memory device once the MSB data has been transferred, according to various embodiments of the present disclosure. Thus, the MSB data might be at least partially transferred from the memory device while the LSB data is still being sensed from selected memory cells, according to various embodiments of the present disclosure. This might reduce the delay from a memory access device requesting data from the memory device and the memory device beginning to provide the requested data to the memory access device. Thus, a memory device according to one or more embodiments of the present disclosure does not need to wait for a complete sense operation of all possible data states of each of the selected memory cells to occur before transferring data.

Figure 5:
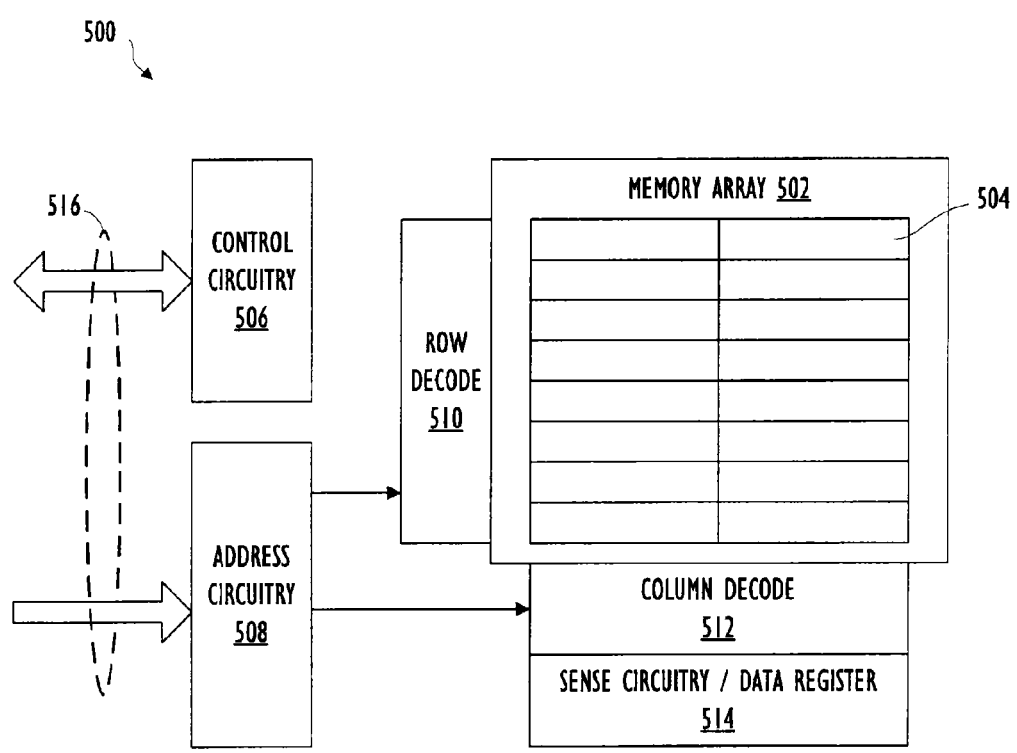
FIG. 5 illustrates a simplified block diagram of a memory device according to an embodiment of the present disclosure.

FIG. 5 illustrates a portion of a memory device 500 according to one or more embodiments of the present disclosure. The memory device 500 shown in FIG. 5 has been simplified to focus on particular elements to improve understanding of various embodiments according to the present disclosure. Memory device 500 comprises a memory array 502, such as an array of flash memory cells, for example. The memory array might be configured in a NAND and/or a NOR configuration. The memory array 502 shown in FIG. 5 might comprise a plurality of individually erasable blocks 504 of memory cells, where each block might comprise one or more pages of memory. The memory cells of each block of memory array 504 might be logically arranged in rows and in columns such as shown in FIGS. 2 and 3, for example. The memory cells of memory array 502 might comprise single level (SLC) and/or multi level (MLC) memory cells.

Memory device 500 further comprises row decode circuitry 510 and column decode circuitry 512 which facilitate access to the memory cells of the memory array 502. Address circuitry 508 provides addressing information to the row decode circuitry 510 and to the column decode circuitry 512. Sense circuitry (e.g., such as sense devices 230/330) and data register 514 help facilitate memory device operations such as reading, writing (e.g., programming) and erase operations. The sense circuitry 514 might detect the data states of a particular group of selected memory cells to be read, for example. Data register 514 might store data sensed by the sense circuitry (e.g., such as sense information obtained during a read or verify operation.) Data register 514 might also store data to be programmed into a particular number of selected memory cells, such as during a programming operation, for example.

Memory device 500 further comprises an internal controller (e.g., control circuitry) 506 which at least in part facilitates memory device operations according to various embodiments of the present disclosure. Control circuitry 506 might comprise hardware, firmware and/or software, for example. The control circuitry 506 might be configured to communicate with an external controller (e.g., memory access device) (not shown) through a communications channel 516. The control circuitry 506 might be coupled to other circuitry of the memory device 500 (not shown), such as to the row decode circuitry 510, column decode circuitry 512 and sense circuitry/data register 514 circuitry, for example.

Figure 6:
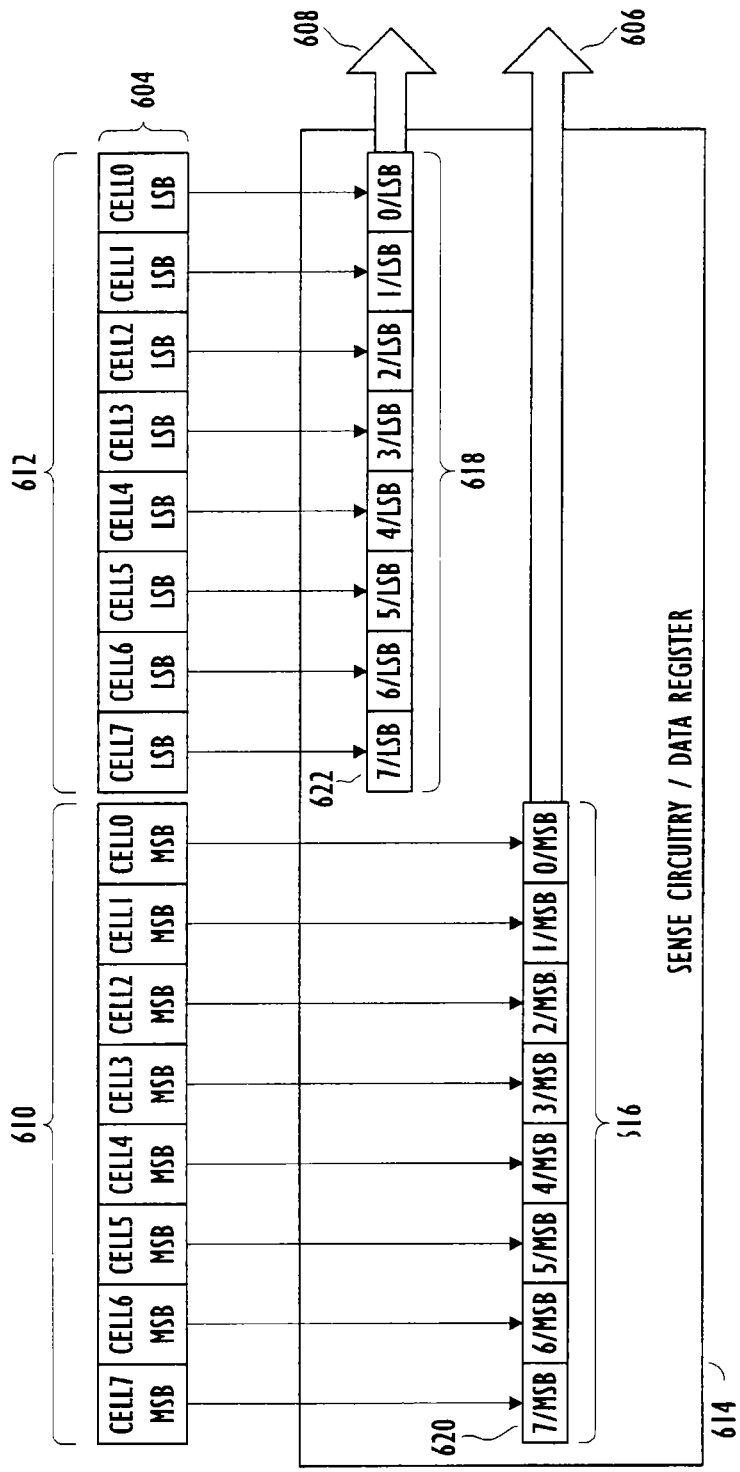
FIG. 6 illustrates a simplified block diagram of a portion of a memory device according to an embodiment of the present disclosure.

FIG. 6 illustrates a portion of the memory device as shown in FIG. 5 according to one or more embodiments of the present disclosure. A particular group of memory cells CELL7-CELL0 604 might be selected for a read operation. Data read from the selected memory cells 604 is sensed by the sense circuitry and latched in the data register 614, for example. Register 614 comprises two groups of registers 616, 618. The MSB data of CELL7 might be sensed and stored in a first register location 620 and LSB data of CELL7 might be sensed and stored in a second register location 622, for example. However, various embodiments of the present disclosure are not limited to two groups of registers 616, 618. Further, each group of registers 616, 618 might comprise a different size than the 8 register locations each as shown in FIG. 6, for example.

According to various embodiments of the present disclosure, a first portion of the data state 610 (e.g., MSB data) of the selected memory cells 604 might be determined during a first sense phase. The MSB data sensed during the first sense phase is latched in the data register 614. Once the MSB data is determined for each of the selected memory cells 604, control circuitry, such as control circuitry 506 shown in FIG. 5, of the memory device begins to transfer 606 the stored MSB data. For example, an operation might be performed to shift the MSB data out of the particular register circuitry 616 storing the MSB data. According to various embodiments of the present disclosure, the second portion 612 (e.g., LSB data) of the data stored in one or more of the selected memory cells 604 might be determined during a second sense phase. The sensed LSB data is latched in the register 614 as the second sense phase progresses. Once the LSB data has been determined from all of the selected memory cells 604, the control circuitry begins to transfer 608 the latched LSB data from the register 614 following the transfer of the latched MSB data determined previously. It should be noted that the second sense phase might occur at least partially concurrent with the transfer of the MSB data sensed during the first sense phase according to one or more embodiments of the present disclosure.

Figure 7:
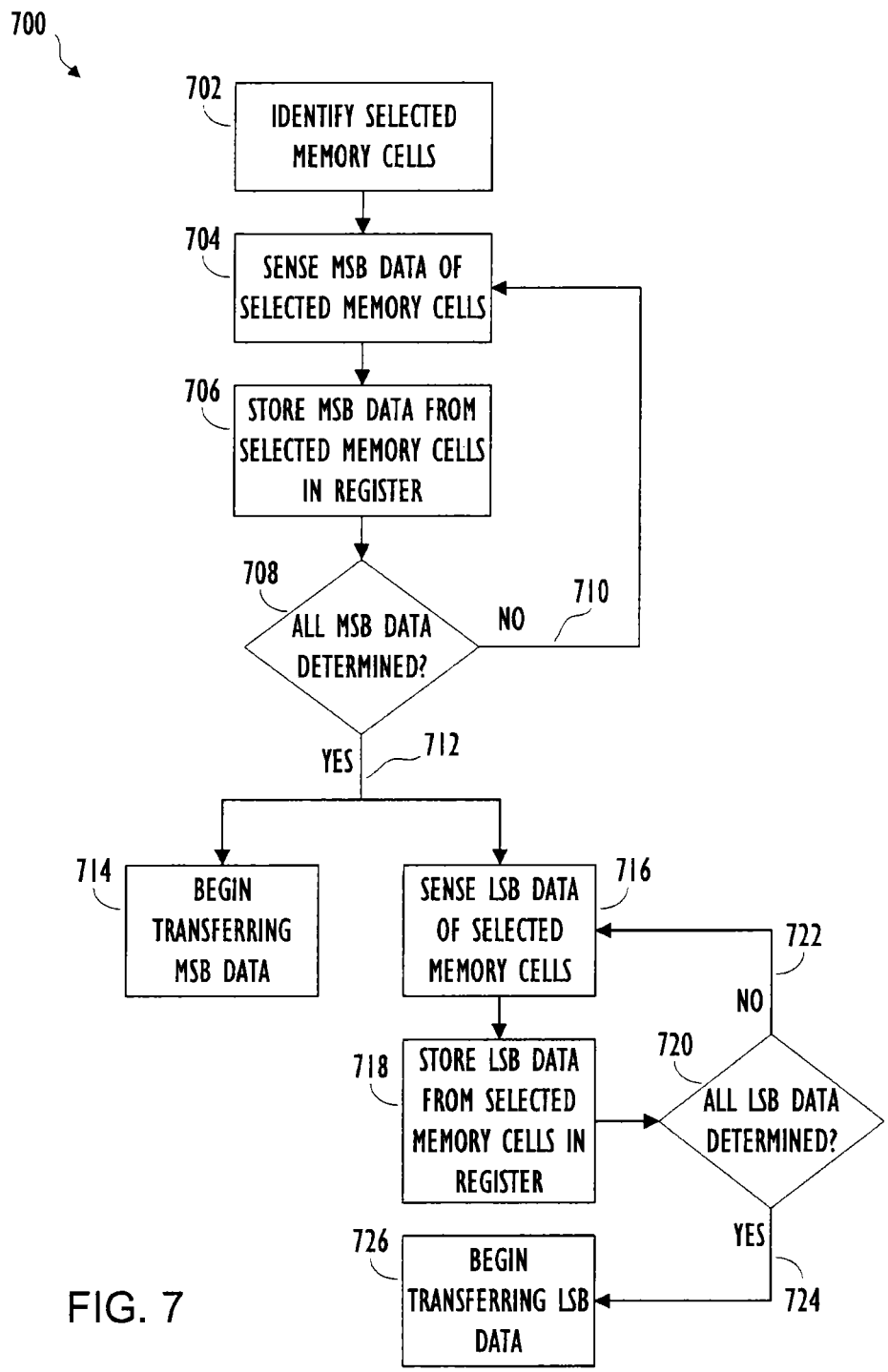
FIG. 7 illustrates a flow chart representative of a method according to an embodiment of the present disclosure.

FIG. 7 illustrates a flow chart 700 of a method according to one or more embodiments of the present disclosure. During a first portion of the operation 702, a particular group of memory cells of a memory device are identified as memory cells selected for a memory device operation, such as a read operation, for example. The identification of the selected memory cells might be in response to a memory request from a memory access device coupled to the memory device.

During a first sense phase, one or more sense operations might be performed 704 on the selected memory cells to determine and store a first portion of a data state 706 (e.g., an MSB value) of each of the selected memory cells. For example, the first sense phase might be comparable to the first sense phase discussed above with respect to FIG. 6, for example. A determination 708 is made if all the MSB values have been determined from the selected memory cells. The first sense phase 704/706/708 continues if all the MSB values have not yet been determined 710. Once all the MSB values for the selected memory cells have been determined 712, control circuitry of the memory device initiates a transfer of the determined MSB data 714 from the register in which the MSB is stored, such as indicated by 606 in FIG. 6, for example.

A second sense phase 716/718/720 is initiated following the determination of the MSB data 712. The second sense phase facilitates the determination 716 and storage 718 of a second portion of the data state (e.g., an LSB value) of each of the selected memory cells. A determination 720 is made to determine if the LSB data of each of the selected memory cells has been determined. If not 722, the second sense phase 716/718/720 continues until the LSB data state of each selected memory cell is determined. Upon completion of determining the LSB of each of the selected memory cells 724 and storing the LSB data in the register, the control circuitry of the memory device will transfer the LSB data 726 following the transfer of the MSB data 714 according to various embodiments of the present disclosure. It should be noted that the initiation of the transfer of the MSB data 714 occurs prior to completing the second sense phase (e.g., prior to initiating the second sense phase or during the second sense phase) according to one or more embodiments of the present disclosure.

Figure 8:
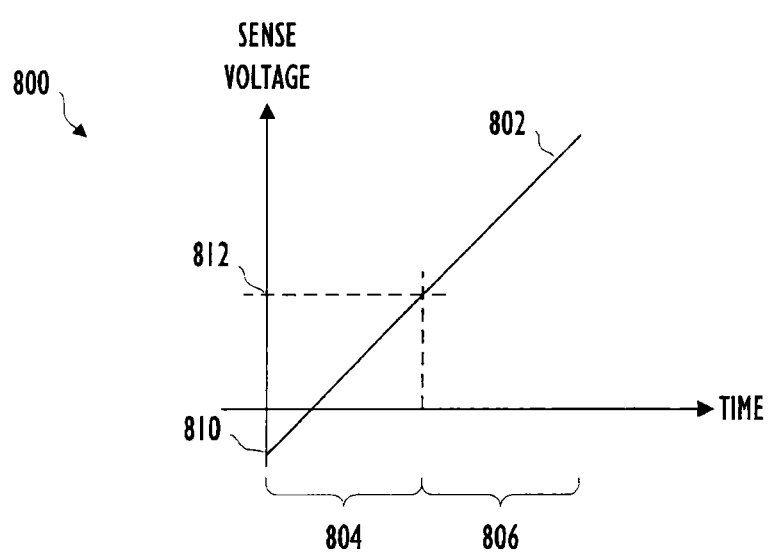
FIG. 8 illustrates a plot of an applied sense potential according to an embodiment of the present disclosure.

FIG. 8 illustrates a plot of a sense potential applied during sensing operations according to various embodiments of the present disclosure. The increasing sense potential 802 might be applied to a particular word line of a particular row comprising a particular number of selected memory cells, for example. The waveform 802 is illustrated as a continually increasing potential, however, the various embodiments are not so limited. For example, the applied potential might comprise a multi-stepped potential applied to the selected word line for example. The sense potential 802 is applied to the selected memory cells starting at a particular level shown at point 810. As the sensing operations progress, the applied sense potential 802 increases over time. A first sense phase might be considered to occur over the time interval 804 and a second sense phase might be considered to occur over the time interval 806, for example. The first sense phase might facilitate a determination of the MSB data of the selected memory cells and the second sense phase might facilitate a determination of the LSB data of at least some of the selected memory cells such as discussed above with respect to FIGS. 6 and 7, for example.

Figure 9:
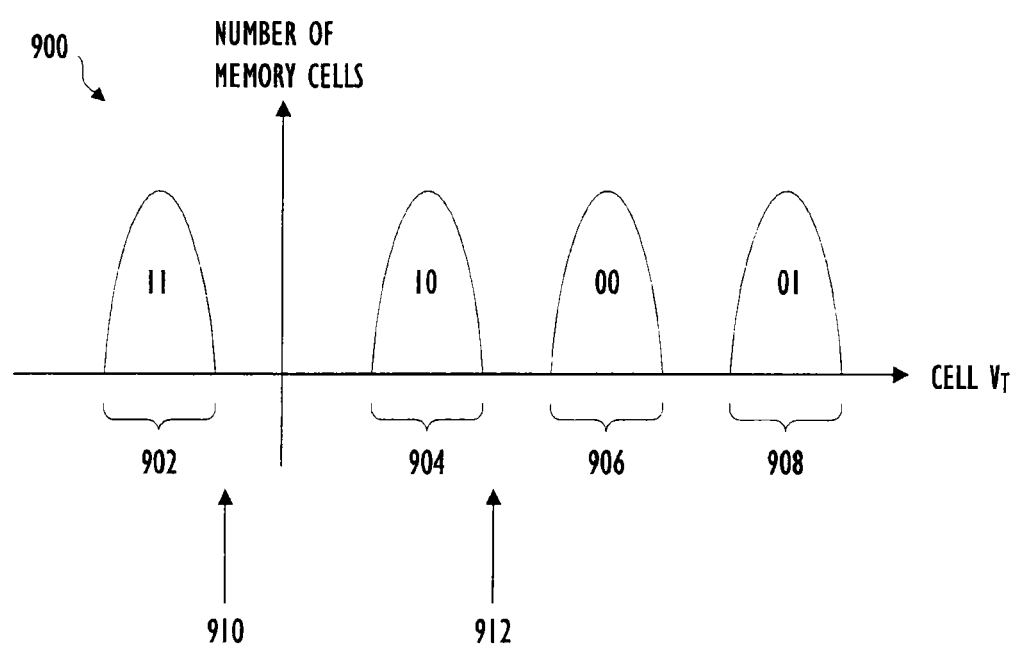
FIG. 9 illustrates a graphical representation of threshold voltage ranges in a population of memory cells.

FIG. 9 illustrates a number of threshold voltage distributions 902-908 corresponding to a number of possible data states that might be stored in the selected memory cells according to various embodiments of the present disclosure. For example, the data states might comprise an 'XY' data state where the 'X' position represents an MSB portion and the 'Y' position represents an LSB portion of the data states. During a particular (e.g., first) sense phase according to one or more embodiments of the present disclosure, the applied sense potential 802 shown in FIG. 8 might have a starting level represented by the point 810 of FIG. 8. The point 810 of FIG. 8 might correspond to the point 910 shown in FIG. 9, for example. The application of the applied sense potential having a starting level illustrated by 810/910, might comprise an initial sense operation in that both the MSB and LSB would be known for memory cells having a Vt less than the 810/910 level. A particular selected memory cell having a Vt below the 810/910 level might be assumed to be in an erased (e.g., logical '11') 902 state, for example. The LSB data might also be known for a memory cell having a Vt determined during the first sense operation to reside in the range 904 (e.g., logical '10'), for example. As discussed above with respect to FIG. 6, LSB data when determined might be stored in a register, such as the register locations 618 according to various embodiments of the present disclosure.

Referring again to FIGS. 8 and 9, as the first sense phase progresses, the applied sense potential 802 increases. The first sense phase might be complete as the applied sense potential 802 reaches a level represented by the point 812 shown in FIG. 8. The point 812 shown in FIG. 8 might correspond to the point 912 shown in FIG. 9, for example. Once the applied sense potential 802 reaches the point 812/912, a determination can be made of the MSB (i.e., the 'X' data state bit position) value for each selected memory cell. Thus, more than one sense operation might be performed during the first sense phase, such as two sense operations as represented by the points 910 and 912 according to various embodiments of the present disclosure. As discussed above, once a particular portion of a data state of each selected memory cell has been determined and stored, the memory device control circuitry might begin to transfer the stored particular determined data from the memory device. Thus, according to one or more embodiments of the present disclosure, the control circuitry might begin to transfer the determined MSB data from the memory device as soon as the first sense phase, such as represented by time interval 804 shown in FIG. 8, is complete.

A second sense phase can begin following the completion of the first sense phase according to various embodiments of the present disclosure. This second sense phase might be represented by the time interval 806 shown in FIG. 8, for example. The applied sense potential 802 continues to increase through the second sense phase. The second sense phase might be performed to determine the remaining data state values for the selected memory cells. For example, the second sense phase might facilitate a determination whether either of the threshold voltage distributions, e.g., 906 and 908, apply to a selected memory cell. It should be noted that as discussed above, the MSB data determined during the first sense phase might be transferred from the memory device during at least a portion of the second sense phase according to one or more embodiments of the present disclosure, for example.

Memory devices according to various embodiments of the present disclosure are not limited to two level MLC memory cells (e.g., storing only an MSB and an LSB.) Various embodiments might store additional data (e.g., bits) between an MSB and an LSB stored in the memory cells. For example, a memory cell of a memory device according to one or more embodiments might store three bits per cell (e.g., representing an 'XYZ' bit pattern) such as represented by distributions 1002-1016 shown in FIG. 10, for example. The 'X' (e.g., MSB) position bit values for each of the selected memory cells might be determined and stored followed by initiating a transfer operation of the MSB bit values from the memory device. At least partially concurrent with the transfer of the MSB bit values, the 'Y' position bit values might be sensed, stored and transferred from the memory device. Finally, at least partially concurrent with transferring the 'Y' position bit values, the 'Z' (e.g., LSB) position bit values are sensed, stored and transferred following the output of the 'Y' position bit values according to various embodiments of the present disclosure. Thus, as the particular bit values for a particular bit position of data stored in selected memory cells are determined and stored in the register, the memory device might initiate an operation to transfer the data while still performing sense operations on the selected memory cells to determine the remaining bit values (e.g., bit position data) according to various embodiments of the present disclosure.

By way of example, an increasing sense potential might be applied to a selected row of selected memory cells in an array of memory such as described above with respect to FIG. 8, for example. The applied sense potential might start at a particular level associated with the point 1018 shown in FIG. 10 and increase over time in a ramped or stepped manner As the applied sense potential achieves a particular level associated with the point 1020, it can be determined that any memory cells which have not yet been activated have a data state of '0' in their MSB (i.e., position 'X' of 'XYZ') position. Thus, at this point 1020, the registers storing the MSB data for the selected memory cells might be accessed and the control circuitry of the memory device might begin to transfer the stored MSB data values. This transfer of MSB data might occur while the applied sense potential continues to increase in order to sense the data states of the remaining bit positions, such as positions 'Y' and 'Z', of the selected memory cells according to various embodiments of the present disclosure, for example.

Figure 10:
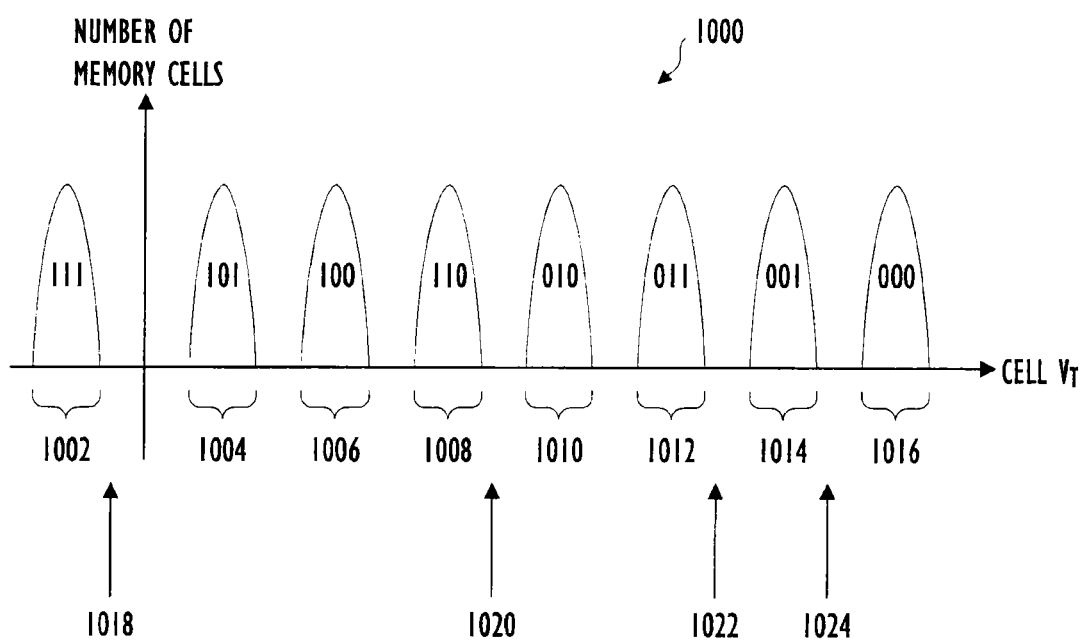
FIG. 10 illustrates a graphical representation of threshold voltage ranges in a population of memory cells.

Continuing with the present example, as the applied sense potential achieves a level associated with point 1022 as shown in FIG. 10, the data state of the middle bit position (i.e., 'Y' position of 'XYZ') for all the selected memory cells is known and can be stored in the register and transferred from the memory device following the transfer of the previously determined 'X' data state values as discussed above, for example. This process continues until each portion of each data state of each selected memory cell has been determined and output from the memory device. For example, as the applied sense potential achieves a level associated with point 1024 as shown in FIG. 10, the data state of the LSB bit position (i.e., 'Z' position of 'XYZ') for all the selected memory cells is known and can be stored in the register and transferred from the memory device. Thus, according to various embodiments of the present disclosure, a first sense phase might comprise four sense operations to determine data states 1002-1008, a second sense phase might comprise two sense operations to determine data states 1010-1012, and a third sense phase might comprise one sense operation to determine data states 1014-1016 of the selected memory cells, for example.

Thus, according to various embodiments of the present disclosure, the memory device might transfer data which has been determined while additional data yet to be determined is still being sensed in the selected memory cells of the memory device. This facilitates an improved response time (i.e., data latency) of a memory device in beginning to transfer data from the memory device, for example.

Figure 11:
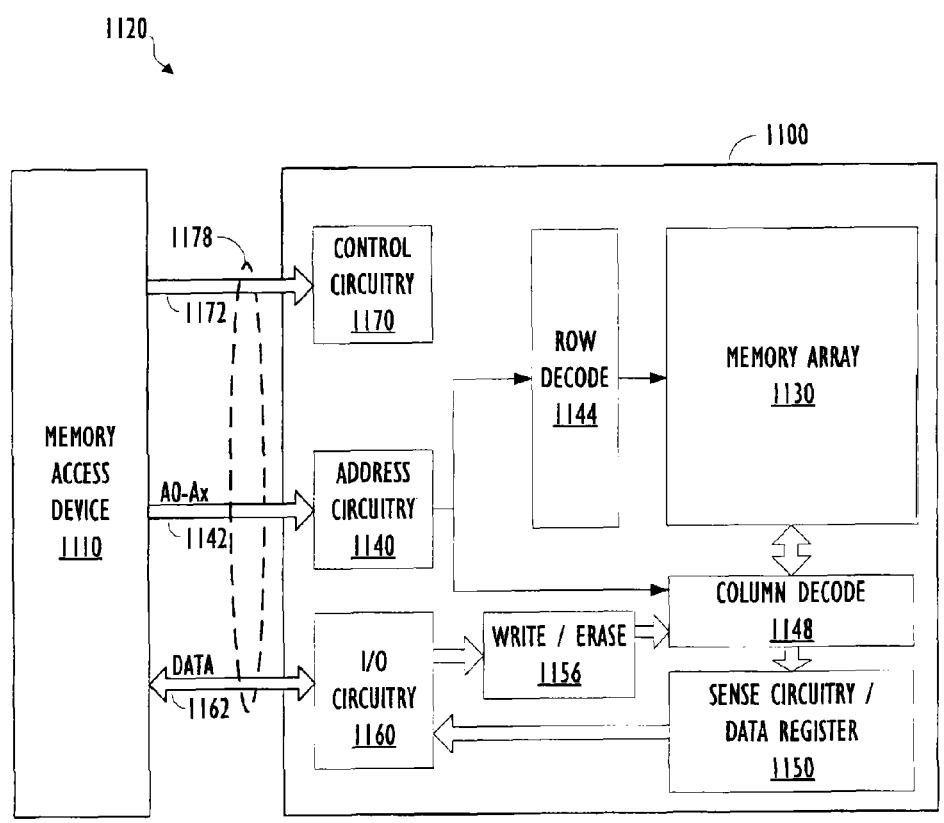
FIG. 11 is a simplified block diagram of a memory device coupled to a memory access device as part of an electronic system according to an embodiment of the present disclosure.

FIG. 11 is a functional block diagram of an electronic system having at least one memory device 1100 according to one or more embodiments of the present disclosure. The memory device 1100 illustrated in FIG. 11 is coupled to an external controller (e.g., memory access device) 1110. The memory access device 1110 might be a microprocessor or some other type of controlling circuitry. The memory device 1100 and the memory access device 1110 form part of an electronic system 1120. According to one or more embodiments of the present disclosure, the memory device 1100 might comprise the memory device 500 discussed above with respect to FIG. 5, for example. The memory device 1100 has been simplified to focus on features of the memory device that are helpful in understanding various embodiments of the present disclosure.

The memory device 1100 includes one or more memory arrays 1130 that might comprise NOR configured and/or NAND configured memory arrays. According to one or more embodiments, the memory cells of memory array 1130 are flash memory cells. The memory array 1130 might include multiple banks and blocks of memory cells residing on a single or multiple die as part of the memory device 1100. Memory array 1130 might comprise SLC and/or MLC memory and might be adaptable to store varying densities (e.g., MLC (four level) and MLC (eight level)) of data in each cell, for example.

An address buffer circuit 1140 is provided to latch address signals provided on address input connections A0-Ax 1142. Address signals are received and decoded by a row decoder 1144 and a column decoder 1148 to access the memory array 1130. Row decoder 1144 might comprise driver circuits configured to drive the word lines of the memory array 1130, for example. It will be appreciated by those skilled in the art, with the benefit of the present description, that the number of address input connections 1142 might depend on the density and architecture of the memory array 1130. That is, the number of address digits increase with both increased memory cell counts and increased bank and block counts, for example.

The memory device 1100 reads data in the memory array 1130 by sensing voltage or current changes in the memory array columns using sense devices, such as sense/data register circuitry 1150. The sense/data register circuitry 1150, in at least one embodiment, is coupled to read and latch a row of data from the memory array 1130. Data input and output (I/O) buffer circuitry 1160 is included for bi-directional data communication over a plurality of data connections 1162 with the memory access device 1110. Write/erase circuitry 1156 is provided to facilitate writing data to or to erasing data from the memory array 1130.

The memory device 1100 further comprises an internal controller (e.g., control circuitry) 1170 which is configured at least in part to implement various embodiments of the present disclosure, such as facilitating the transfer of data prior to finishing a complete sense operation on a particular number of selected memory cells as discussed above, for example. In at least one embodiment, the control circuitry 1170 might utilize a state machine. Control circuitry 1170 might be similar in configuration and functionality as control circuitry 506 discussed above with respect to FIG. 5, for example.

Control signals and commands can be sent by the memory access device 1110 to the memory device 1100 over the command bus 1172. The command bus 1172 may be a discrete signal line or may be comprised of multiple signal lines, for example. These command signals 1172 can be used to control the operations on the memory array 1130, including data read, data write (e.g., program), and erase operations. The command bus 1172, address bus 1142 and data bus 1162 may all be combined or may be combined in part to form a number of standard interfaces 1178. The interface 1178 between the memory device 1100 and the memory access device 1110 might be one of a Universal Serial Bus (USB) interface or Serial Peripheral Interface (SPI) bus, for example. The interface 1178 might also be a standard interface used with many hard disk drives (e.g., SATA, PATA) as are known to those skilled in the art.

The electronic system illustrated in FIG. 11 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide data sensing and transfer methods in a memory device. For example, particular significant bit values can be sensed in multilevel memory cells and transferred while a different significant bit value from the selected memory cells are being sensed. Thus, the memory device might begin to transfer data which can be determined quickly while data which consumes more time to be determined is sensed. These methods might facilitate an improved data latency characteristic of the memory device.

Although specific embodiments have been illustrated and described herein, it will be appreciated by those of ordinary skill in the art that other configurations may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, comprising:
   for each memory cell selected for a particular sense operation, determining whether each selected memory cell has any data state of a first subset of data states of a plurality of data states, wherein whether a memory cell has a data state that is a member of the first subset of data states determines a data value of a first portion of the data state of that memory cell; and
   initiating a transfer of the data values of the first portions of the data states of the selected memory cells and continuing the particular sense operation to sense for additional data states of the plurality of data states.

2. The method of claim 1, wherein initiating a transfer of the data values of the first portions of the data states of the selected memory cells begins concurrently with continuing the particular sense operation to sense for additional data states of the plurality of data states.

3. The method of claim 1, wherein continuing the particular sense operation to sense for additional data states of the plurality of data states occurs after determining whether each selected memory cell has any data state of the first subset of data states of a plurality of data states and before initiating the transfer of the data values of the first portions of the data states of the selected memory cells.

4. The method of claim 1, wherein the first portion of the data state corresponds to a bit position of the data state.

5. The method of claim 1, further comprising:
   for each memory cell selected for the particular sense operation, determining whether each selected memory cell has any data state of a second subset of data states of the plurality of data states, wherein whether a memory cell has a data state that is a member of the second subset of data states determines a data value of a second portion of the data state of that memory cell;
   wherein the first subset of data states and the second subset of data states are mutually exclusive.

6. The method of claim 5, further comprising:
   initiating a transfer of the data values of the second portions of the data states of the selected memory cells and continuing the particular sense operation to sense for additional data states of the plurality of data states.

7. The method of claim 5, further comprising storing the data values of the first portions of the data states of the selected memory cells and the data values of the second portions of the data states of the selected memory cells in register circuitry of the memory device.

8. The method of claim 7, wherein initiating a transfer of the data values of the first portions of the data states of the selected memory cells comprises initiating a transfer to shift the data values of the first portions of the data states of the selected memory cells out of the register circuitry prior to storing all of the data values of the second portions of the data states of the selected memory cells in the register circuitry.

9. The method of claim 5, further comprising:
   completing the transfer of the data values of the first portions of the data states of the selected memory cells before completing determining whether each selected memory cell has any data state of the second subset of data states of the plurality of data states.

10. The method of claim 5, further comprising:
    for each memory cell selected for the particular sense operation, determining whether each selected memory cell has any data state of a third subset of data states of the plurality of data states, wherein whether a memory cell has a data state that is a member of the third subset of data states determines a data value of a third portion of the data state of that memory cell;
    wherein the first subset of data states, the second subset of data states and the third subset of data states are mutually exclusive.

11. The method of claim 10, further comprising:
    initiating a transfer of the data values of the third portions of the data states of the selected memory cells and continuing the particular sense operation to sense for additional data states of the plurality of data states.

12. The method of claim 1, wherein the particular sense operation comprises applying an increasing sense potential to a control gate of each selected memory cell.

13. The method of claim 12, wherein applying an increasing sense potential comprises applying a stepped sense potential.

14. The method of claim 12, wherein continuing the particular sense operation comprises continuing to apply the increasing sense potential to the control gate of each selected memory cell.

15. The method of claim 1, wherein initiating a transfer of the data values comprises initiating a transfer of the data values from register circuitry of the memory device.

16. The method of claim 1, wherein initiating a transfer of the data values comprises initiating a transfer of the data values from register circuitry of the memory device for output from the memory device.

17. A method of operating a memory device, comprising:
    for each memory cell selected for a particular sense operation, determining whether each selected memory cell has threshold voltage within a first range of voltages, wherein whether a memory cell has a threshold voltage that is within the first range of voltages determines a data value of a first portion of a data state of that memory cell;
    initiating a transfer of the data values of the first portions of the data states of the selected memory cells;
    determining whether each selected memory cell has threshold voltage within a second range of voltages at least partially while transferring the data values of the first portions of the data states of the selected memory cells, wherein whether a memory cell has a threshold voltage that is within the second range of voltages determines a data value of a second portion of the data state of that memory cell;
    wherein each voltage of the second range of voltages is different than any threshold voltage of the first range of voltages.

18. The method of claim 17, further comprising:
    initiating a transfer of the data values of the second portions of the data states of the selected memory cells.

19. The method of claim 18, further comprising:
    determining whether each selected memory cell has threshold voltage within a third range of voltages at least partially while transferring the data values of the second portions of the data states of the selected memory cells, wherein whether a memory cell has a threshold voltage that is within the third range of voltages determines a data value of a third portion of the data state of that memory cell;

wherein each voltage of the third range of voltages is different than any threshold voltage of the first range of voltages and different than any threshold voltage of the second range of voltages.

20. The method of claim 19, wherein a first subset of data states of a plurality of data states corresponds to threshold voltages within the first range of voltages, a second subset of data states of the plurality of data states corresponds to threshold voltages within the second range of voltages, and a third subset of data states of the plurality of data states corresponds to threshold voltages within the third range of voltages.

\* \* \* \* \*